United States Patent [19]  [11]  4,451,971
Milgram  [45]  Jun. 5, 1984

[54] LIFT-OFF WAFER PROCESSING
[75] Inventor: Alvin Milgram, Sunnyvale, Calif.
[73] Assignee: Fairchild Camera and Instrument Corporation, Mountain View, Calif.
[21] Appl. No.: 404,110
[22] Filed: Aug. 2, 1982
[51] Int. Cl.³ ............................................. H01L 21/28
[52] U.S. Cl. ........................................ 29/578; 29/591; 427/82; 427/259; 528/350
[58] Field of Search ................... 29/578, 591; 427/259, 427/82; 528/350

[56] References Cited
U.S. PATENT DOCUMENTS 3,985,597  10/1976  Zielinski ................................ 156/11
4,004,044   1/1977  Franco et al. .......................... 427/43
4,026,876   5/1977  Bateman et al. ..................... 528/350
4,107,174   8/1978  Baumann et al. ............... 528/350 X
4,168,999   9/1979  Vora et al. ......................... 148/1.5 X
4,238,528  12/1980  Angelo et al. ................... 528/350 X
4,371,423   2/1983  Yoshizawa et al. ............... 29/578 X OTHER PUBLICATIONS
IEEE Transactions on Electron Devices, vol. ED-28, No. 5, (May 1981), pp. 552–556, "Polyimide Liftoff Technology . . . LSI Metallization".
J. M. Frary and P. Seese, Dec. 1981, Semiconductor International, pp. 72–89, "Lift–Off Techniques for Fine Line Metal Patterning".

Primary Examiner—G. Ozaki
Attorney, Agent, or Firm—Kenneth Olsen; Carl L. Silverman; James M. Heslin

[57] ABSTRACT

An improved lift-off process for forming metallized interconnections between various regions on a semiconductor device relies on the use of a particular polyimide in forming a protective mask over the device. The polyimide is a copolymer of an aromatic cycloaliphatic diamine and a dianhydride which allows the resulting structure to withstand particularly high temperatures in the fabrication process. In particular, the polyamide when subjected to high temperature metallization under vacuum remains sufficiently soluble to be substantially completely removed from the device by immersion in common organic solvents. This allows high temperature metallization as interconnects for integrated circuits.

3 Claims, 5 Drawing Figures

LIFT-OFF WAFER PROCESSING

BACKGROUND OF THE INVENTION

1. Field of the Invention

This invention relates to the fabrication of integrated circuit structures, and in particular, to the fabrication of metal conducting lines on the surface of such structures using lift-off wafer processing techniques.

2. Description of the Prior Art

In fabricating integrated circuits and other semiconductor devices, various surface regions of the semiconductor device must be interconnected. The most common method for providing such interconnections comprises forming a layer of an electrically conductive material on the surface of the device, applying a protective mask over those portions of the electrically conductive layer which correspond to the desired pattern of interconnections, and removing those portions of the electrically conductive layer which are not protected by the mask, typically by chemical etching.

Although workable, such conventional processes suffer from a number of disadvantages, particularly when interconnecting exceptionally small regions on the semiconductor device. For example, to ensure complete removal of the unmasked portions of the conductive layer, the pattern must always be at least slightly "over-etched," leading to diminished line widths for a particular line spacing. With very small regions, there is little or no tolerance for such diminished line widths. Although this problem can be lessened by using plasma or reactive ion etching, such processes in turn create undesirable chemical contamination on the surface of the semiconductor device.

As an alternative to such conventional etching techniques, lift-off techniques for forming the desired interconnection pattern on the surface of the semiconductor device have been developed. In general, such lift-off techniques deposit a masking layer directly on the surface of the semiconductor device, exposing only those portions of the surface where it is desired to form the interconnections. By then depositing the conductive material (usually referred to as the metallization layer) on top of the mask, the excess conductive material is blocked from the surface of the semiconductor device by the mask and may be physically lifted by removal of the masking layer. Such lift-off techniques offer superior line width control in the micron and submicron realm because the dimensions of the interconnection pattern are determined by the openings in the mask rather than by the amount of metal removed during an etching process. Moreover, damage to the semiconductor device from radiation is minimized because the device itself is not subjected to plasma or reactive ion etching. A survey of various lift-off processes is presented in "Lift-off Techniques For Fine Line Metal Patterning," by J. Frary and P. Seese, *Semiconductor International*, Sept. 1981, pp. 72–89.

Such lift-off techniques themselves, however, suffer from certain drawbacks. The most serious drawback is that the metallization layer must be deposited at relatively low temperatures because of poor heat resistance of the materials most commonly used as the lift-off layer. This degrades the electrical characteristics of the devices and lowers the yield of the metalization patterns. To overcome this problem, the use of a polyimide film as the lift-off layer has been suggested. Homma, et al., "Polyimide Lift-off Technology for High Density LSI Metallization," *IEE Transactions on Electron Devices*, Vol. Ed. 28, No. 5, May, 1981, pp. 552–556.

While the use of a polyimide mask overcomes the limitation on high temperature metallization, it presents certain disadvantages of its own. Removal of the polyimide layer usually requires electrolytic etching since the high temperature metallization renders the polyimide insoluble. Even with such etching, it often difficult to completely remove the polyimide from the surface of the semiconductor device at the end of the fabrication process. Incomplete removal of the polyimide generally results in lower yields by creating short circuits or obscuring portions of the surface of the semiconductor device from subsequent processing operations. It would therefore be desirable to provide a masking material suitable for high temperature metallization which remains soluble in common organic solvents to facilitate complete removal of the material from the surface of the device.

SUMMARY OF THE INVENTION

The present invention provides an improved structure and technique for fabricating semiconductor devices by lift-off processing techniques. By forming a masking layer of a polyimide which is a copolymer of an aromatic cycloaliphatic diamine and a dianhydride, the polyimide material remains soluble in common organic solvents even after high temperature metallization and can be completely and easily removed from the surface of the semiconductor device.

DESCRIPTION OF THE PREFERRED EMBODIMENT

The present invention provides a layered semiconductor structure and a process for forming the structure and utilizing the structure to deposit a particular metallization pattern on a surface of the semiconductor device. By employing a particular polyimide material as a masking layer adjacent the surface of the semiconductor device, it has been found that the mask remains soluble yet dimensionally stable and can be removed even after high temperatures metallization, in the range from about 250° to 325° C., which allows step coverage of metallization over sharp steps or topographical structures on the semiconductor wafer. Moreover, despite it solubility, the polymide is dimensionally stable even at high temperatures and allows the formation of grates as small as about 1.0 $\mu$m. The layered structure (photoresist-barrier-polyimide) processes readily without disintegrating and without degradation of the pattern imparted from the initial transfer mask.

The particular polyimide is a copolymer of an aromatic cycloaliphatic diamine and a dianhydride. Such polyimides are described in U.S. Pat. No. 4,026,876 to Bateman, et al., the disclosure of which is incorporated herein by reference, and are characterized by a recurring unit having the following structural formula:

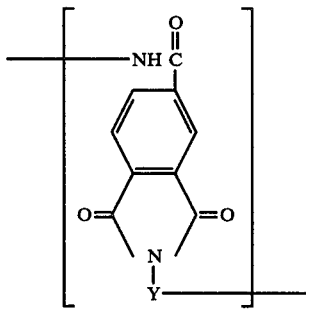

wherein Y is a divalent organic radical selected from carbocyclic-aromatic, aliphatic, araliphatic, cycloaliphatic, and heterocyclic radicals, combinations of these, and radicals with heteroatom containing bridging groups where the heteroatom in the bridge is oxygen, sulphur, nitrogen, silicon or phosphorus, provided that, out of the total number of polyamide-imide recurring units, 1 to 100 percent, preferably 10 to 100 percent of such units, have Y equal to a phenylindane radical of the structural formula:

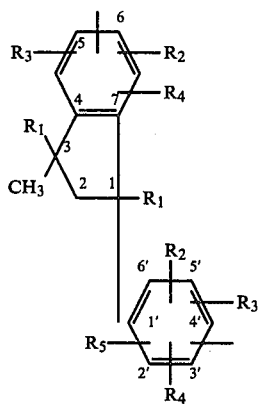

wherein $R_1$ is a hydrogen or lower alkyl, preferably lower alkyl of 1 to 5 carbon atoms, and $R_2$, $R_3$, $R_4$ and $R_5$ are independently hydrogen, halogen or lower alkyl, preferably, lower alkyl of 1 to 4 carbon atoms, and either aromatic ring of the unsymmetrical phenylindane radical may be bonded to an amide or imide nitrogen.

In particular, 5-amino-1-(4'-aminophenyl)-1,3,3-trimethylindane may be polymerized with a dianhydride such as benzophenonetetracarboxylic dianhydride or pyromellitic dianhydride, affording polyimides which are soluble in relatively non-polar solvents.

Figure 1:
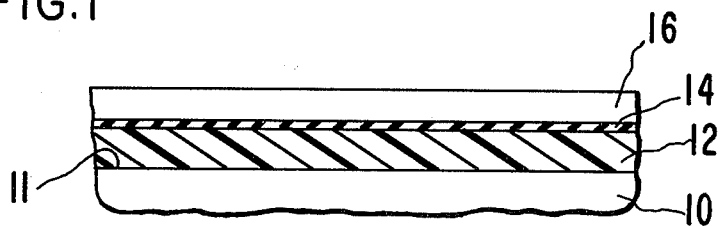
FIG. 1 is a cross sectional view of a semiconductor device having layers of a polyimide masking material, a barrier material and a photoresist material thereon.

FIG. 1 is a cross sectional view of a semiconductor device structure including a silicon wafer 10, a layer 12 of the polyimide just described, a barrier layer 14 and a mask or photoresist layer 16. The wafer 10 will typically be a partially completed integrated circuit or other semiconductor device which may include active and passive electronic components, layers of electrically conducting material, or other desired regions. The process and structure of the present invention are not limited to any particular form of wafer 10 and are compatible with a wide variety of wafer characteristics.

Befor depositing the polyimide layer, an adhesion promoter is applied to a surface 11 of wafer 10 to provide improved adhesion between the polyimide layer and the surface. Suitable adhesion promoters include HMDS manufactured by Petrarch Systems and VM-651 manufactured by DuPont. Typically, these materials are applied to a thickness of from 5 to 6 nanometers using a spinning operation such as is well known in the art.

The polyimide material is then deposited on the surface 11 of wafer 10 using well known techniques such as spinning, dipping, spraying, brushing and the like. The polyimide is applied to a thickness of from about 1.5 to 4.0 microns in a solvent solution. Suitable solvents include various common organic solvents such as methylene chloride, m-cresol, chloroform, nitrobenzene, N-methylformamide, pyridine and the like. The polyimide is cured by oven heating in air. A maximum temperature of from about 280° C. is allowable while still maintaining solubility of the polyimide in the organic solvents just described. The duration of the curing step should be limited to less than one hour to avoid cross-linking of the polymers. Such cross linking is undesirable since it leads to insolubility.

The barrier layer 14 is deposited on top of the polyimide layer 12 in order to protect the polyimide layer during the photolithography process which occurs later in the fabrication process. Usually, the barrier layer comprises a layer of silicon dioxide applied by plasma assisted chemical vapor deposition (CVD) at from about 180° to 250° C. to a thickness in the range from 0.10 μm to 0.15 μm. Alternatively, silicon oxide, silicon, germanium, aluminum, aluminum oxide, chromium, gold or nickel may be deposited by vacuum deposition. When an electron beam is to be used for direct write on the wafer 10, it will be desirable to use a barrier layer of indium-tin oxide, silicon or germanium deposited by RF sputtering or CVD in order to have an electrically conducting layer that has sufficient optical transmission to allow alignment for photolithography steps.

On the upper surface of the barrier layer 14, a layer 16 of positive photoresist having a thickness between 0.5 and 1.0 μm is deposited using conventional techniques. The photoresist layer 16 is cured by baking it at about 90° C. for approximately six minutes. The preferred photoresist is product AZ-1450J available from the Shipley Company, Inc., and has a thickness of approximately 0.5 μm.

Figure 2:
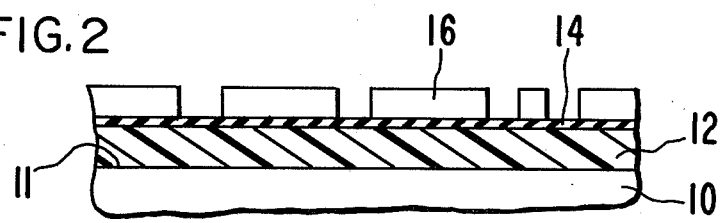
FIG. 2 is a cross sectional view of the structure of FIG. 1 after the desired metallization pattern has been formed in the photoresist layer.

To impart the desired metallization pattern, the photoresist 16 is exposed to the pattern using conventional semiconductor fabrication equipment, such as a Mann Stepper. After such exposure, the photoresist is developed and hard baked for 30 minutes at a temperature of about 135° C. A photolithography sequence, using a mask to define the desired metallization pattern is used. An exposure mask having a clear field or opening in the areas where it is desired to deposit the conductive layer is applied to the photoresist layer. After exposure, the layer is developed, resulting in removal of the photoresist layer 16 in a pattern which matches the desired metallization pattern. The result is illustrated in FIG. 2.

The next step is the removal or etching of the barrier layer 14 using well known techniques. With the exemplary barrier layer of silicon dioxide, the etching can be achieved using carbon tetrafluoride plasma. The etching should be performed for sufficient time to assure complete removal of the barrier layer, usually requiring an additional treatment of about 15% of the time required to etch through the barrier layer 14.

The exposed polyimide layer 12 is then plasma etched, typically using an oxygen plasma. The polyimide is usually etched for a time beyond the end-point in order to ensure complete removal of the polyimide. The process yields an SiO2 overhang projection of about 0.1 μm. This is desirable for lift-off processing because it prevents continuity of the metallization to the top surface. The wall profile is slightly concave, as best observed in FIG. 3, and is satisfactory for lift-off processing while faithfully reproducing the desired pattern in the polyimide. Residual carbonized organic at the base is completely removed by a 30 second exposure to hydrochloric acid. The wafers are then rinsed in distilled water and dried.

Figure 3:
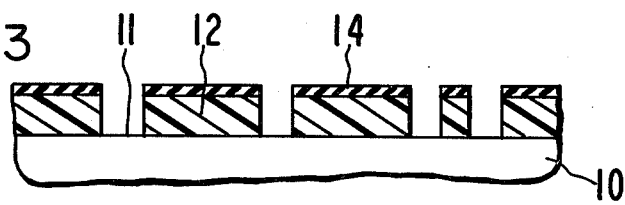
FIG. 3 is a cross sectional view of the structure of FIG. 1 after the desired metallization pattern has been etched in the barrier and polyimide layers.
Figure 4:
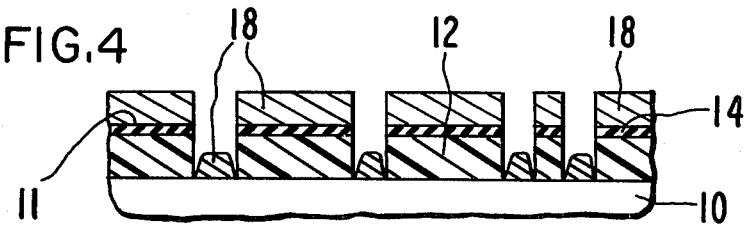
FIG. 4 is a cross sectional view of the structure of FIG. 3 after metallization.

A layer 18 of conductive material is then deposited on the structure of FIG. 3 using flash evaporation in a high vacuum deposition system. The material 18 is an electrically conductive material suitable for interconnecting the various regions on the underlying wafer 10. The material 18, typically a metal, such as aluminum, aluminum-silicon alloy, aluminum-silicon-copper alloy or a metal silicide, is deposited on both the surface 11 of the wafer 10 and on top of the barrier layer 14. The metal may be deposited at any desired thickness. However, it must be sufficiently thin so as not to form a continuous coating across the surface of the structure, but rather only partially fill the openings, as shown. Of course, the thickness of the polyimide layer 14 may be increased to allow more metal to be deposited in the openings without forming a continuous layer of metal. Generally, the polyimide layer 14 will be formed to a thickness of about 25% greater than the desired thickness of the metal 18. To form the metal in the manner depicted in FIG. 4, the metal must be deposited at near normal incidence to the upper surface 11 of wafer 10, although some deviation, usually less than 10°, is acceptable. Using the polyimide mask of the present invention allows high temperature metallization in the range from 250° to 300° C. to be utilized without causing the polyimide to lose solubility, to lose dimensional stability, or to crack from stress.

Figure 5:
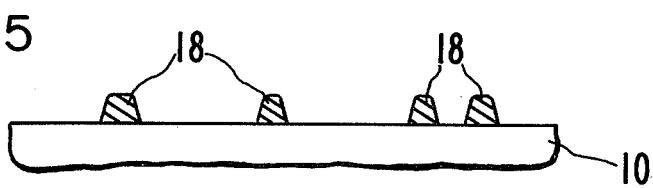
FIG. 5 is a cross sectional view of the structure of FIG. 4 after the lift-off step has been accomplished.

After metallization is complete, the lift-off structure comprising the polyimide layer 12, protective layer 14 and the metal which has been deposited on top of the protective layer may be removed by immersion in a common organic solvent, usually methylene chloride, and application of ultrasonic energy for a period of from 5 to 15 minutes. Heating the solvent decreases the time required to remove the lift-off structure, but is not required. The resulting structure is illustrated in FIG. 5.

The foregoing description is intended to describe the preferred embodiment of the present invention. It will be apparent, however, that numerous modifications and variations may be made in the process and structure without departing from the scope of the invention as defined in the appended claims.

What is claimed is:
1. An improved process for depositing a metallization pattern on the surface of a semiconductor structure, said process comprising:
applying a layer of a polyimide on the surface of the semiconductor, said polyimide being a copolymer of an aromatic cycloaliphatic diamine and a dianhydride consisting essentially of the recurring unit having the formula

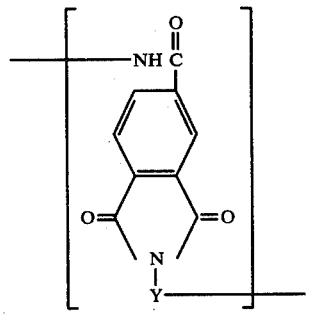

wherein Y is a divalent organic radical selected from carbocyclic-aromatic, aliphatic, araliphatic, cycloaliphatic, and heterocyclic radicals, combinations of these, and radicals with heteroatom-containing bridging groups where the heteroatom in the bridge is oxygen, sulfur, nitrogen, silicon or phosphorus, provided that, out of the total number of polyamide-imide recurring units, 1 to 100 percent of such units have Y equal to a phenylindane radical of the structural formula

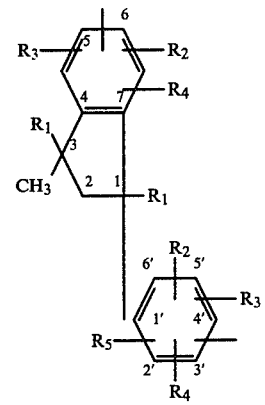

wherein
$R_1$ is a hydrogen or lower alkyl, and
$R_2$, $R_3$, $R_4$ and $R_5$ are independently hydrogen, halogen or lower alkyl, and either aromatic ring of the unsymmetrical phenylindane radical may be bonded to an amide or imide nitrogen;
applying a barrier layer over the polyimide layer;
applying a mask layer over the barrier layer;
defining the desired metallization pattern in the mask layer;
etching the barrier layer and polyimide layer to expose the surface of the semiconductor in a pattern which corresponds to the desired metallization pattern on the mask layer;
metallizing the surface of the semiconductor which has been exposed by the etching; and
removing the polyimide and barrier layers which remain by dissolving the polyimide layer in a substantially non-polar solvent.

2. A process as in claim 1, wherein the metallization is carried out at a temperature in the range from about 250° to 325° C.

3. A process as in claim 1, wherein the metallization is accomplished with an aluminum-silicon-copper alloy.

* * * * *